US010204903B2

(12) United States Patent
Zheng et al.

(10) Patent No.: US 10,204,903 B2
(45) Date of Patent: Feb. 12, 2019

(54) TUNNELING FIELD EFFECT TRANSISTOR

(71) Applicant: GLOBALFOUNDRIES Singapore Pte. Ltd., Singapore (SG)

(72) Inventors: Ping Zheng, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 75 days.

(21) Appl. No.: 15/365,965

(22) Filed: Dec. 1, 2016

(65) Prior Publication Data
US 2018/0158817 A1  Jun. 7, 2018

(51) Int. Cl.
*H01L 27/088* (2006.01)
*H01L 21/8234* (2006.01)
*H01L 29/66* (2006.01)
*H01L 29/78* (2006.01)

(52) U.S. Cl.
CPC .. *H01L 27/0886* (2013.01); *H01L 21/823412* (2013.01); *H01L 21/823431* (2013.01); *H01L 21/823468* (2013.01); *H01L 21/823481* (2013.01); *H01L 29/66545* (2013.01); *H01L 29/7833* (2013.01)

(58) Field of Classification Search
CPC ............ H01L 27/0886; H01L 29/7833; H01L 29/66545; H01L 21/823431; H01L 21/823412; H01L 21/823481; H01L 21/823468
See application file for complete search history.

(56) References Cited

U.S. PATENT DOCUMENTS

2014/0175381 A1* 6/2014 Goh ................ H01L 29/66545
257/39
2016/0099343 A1* 4/2016 Pawlak ............ H01L 29/66977
257/12

* cited by examiner

*Primary Examiner* — Moazzam Hossain
*Assistant Examiner* — Stanetta Isaac
(74) *Attorney, Agent, or Firm* — Horizon IP PTE Ltd.

(57) ABSTRACT

Devices and methods for forming a device are disclosed. A substrate is provided. A plurality of fin structures are formed in the substrate. The fin structures include an upper part and a lower part. An isolation layer is formed on the substrate. The lower part of the plurality of fin structures is embedded in the isolation layer. A source including a first source portion and a second source portion is formed in a first side of the substrate. The first source portion partially occupies the fin structures along a length direction. The second source portion is formed over the first source portion. The second source portion elevates the fin structures. A drain is formed in a second side of the substrate. A distance between the source to the drain defines a channel region. A gate having a gate dielectric and a metal gate electrode is formed over the substrate. The gate wraps around the elevated fin structures and channel region.

18 Claims, 8 Drawing Sheets

TUNNELING FIELD EFFECT TRANSISTOR

BACKGROUND

Tunneling field-effect transistors (TFETs) have emerged in recent years as a direct competition to the metal-oxide semiconductor field-effect transistors (MOSFETs) due to their steep substhreshold swing (SS) of less than 60 mV/decade, which is the scaling limit of MOSFETs. A steep SS at means that a lower voltage is needed to turn on the transistor. As a result, TFETs are capable of operating at low supply voltage (VDD) as compared to MOSFETs.

However, a drawback of TFETs is that TFETs has a lower on-state current ($I_{ON}$) than MOSFETs at the same channel length. This is due to the large band-to-band tunneling barrier (BTBT) which governs the tunneling probability. An increase in the tunneling probability is therefore needed to obtain a higher $I_{ON}$ and enhance the performance of the TFETs.

Therefore, there is a need to provide methods of fabricating TFETs having enhanced performance.

SUMMARY

Embodiments generally relate to semiconductor devices and methods for forming a semiconductor device. In one embodiment, a method for forming a device is disclosed. The method includes providing a substrate. A plurality of fin structures are formed in the substrate. The fin structures include an upper part and a lower part. An isolation layer is formed on the substrate. The lower part of the plurality of fin structures is embedded in the isolation layer. A source including a first source portion and second source portion is formed in a first side of the substrate. The first source portion partially occupies the fin structures along a length direction. The second source portion is formed over the first source portion. Forming the second source portion elevates the fin structures. A drain is formed in a second side of the substrate. A distance between the source to the drain defines a channel region. A gate having a gate dielectric and a metal gate electrode is formed over the substrate. The gate wraps around the elevated fin structures and channel region.

In one embodiment, a method for forming a device is disclosed. The method includes providing a substrate. A plurality of fin structures is formed in the substrate along a length direction. The fin structures include an upper part and a lower part. An isolation layer is formed on the substrate. The lower part of the plurality of fin structures is embedded in the isolation layer. A source region is formed in a first side of the substrate. The source region includes a first source portion and a second source portion formed over the first source portion. The source region partially occupies the fin structures along the length direction. A drain region is formed in a second side of the substrate. A distance between the source region to drain region defines a channel. A gate is formed over the substrate, the gate partially wraps around the source region and channel region. A top surface of the source region is higher than a top surface of the channel region and drain region.

In another embodiment, a device is disclosed. The device includes a substrate. A plurality of fin structures are disposed in the substrate. The fin structures include an upper part and a lower part. An isolation layer is disposed on the substrate. The lower part of the plurality of fin structures is embedded in the isolation layer. A source including a first source portion and a second source portion is disposed in a first side of the substrate. The first source portion partially occupies the fin structures along a length direction. The second source portion is disposed over the first source portion. The second source portion elevates the fin structures. A drain is disposed in a second side of the substrate. A distance between the source to the drain defines a channel region. A gate having a gate dielectric and a metal gate electrode is disposed over the substrate. The gate wraps around the elevated fin structures and channel region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to semiconductor devices. More particularly, some embodiments relate to devices including transistors, such as tunneling field-effect transistors (TFETs). Such devices, for example, can be incorporated into standalone devices or system on chips. The devices or ICs can be incorporated into or used with, for example, consumer electronic products, or relate to other types of devices.

Figure 1A:
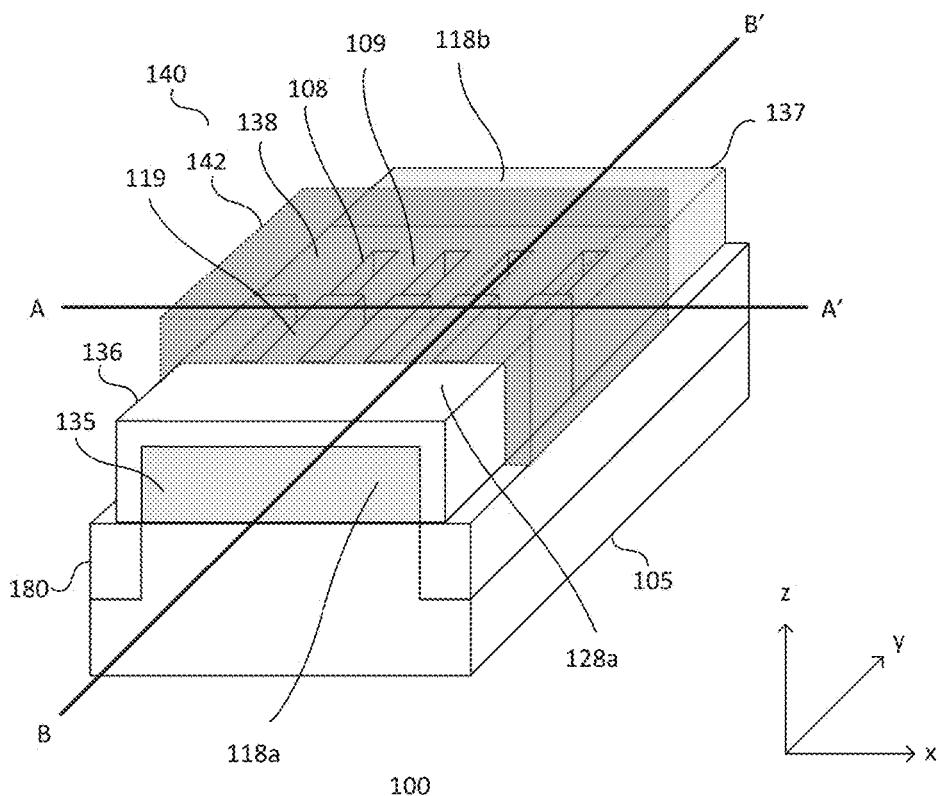
FIGS. 1a-1d show various views of an embodiment of a device.
Figure 1B:
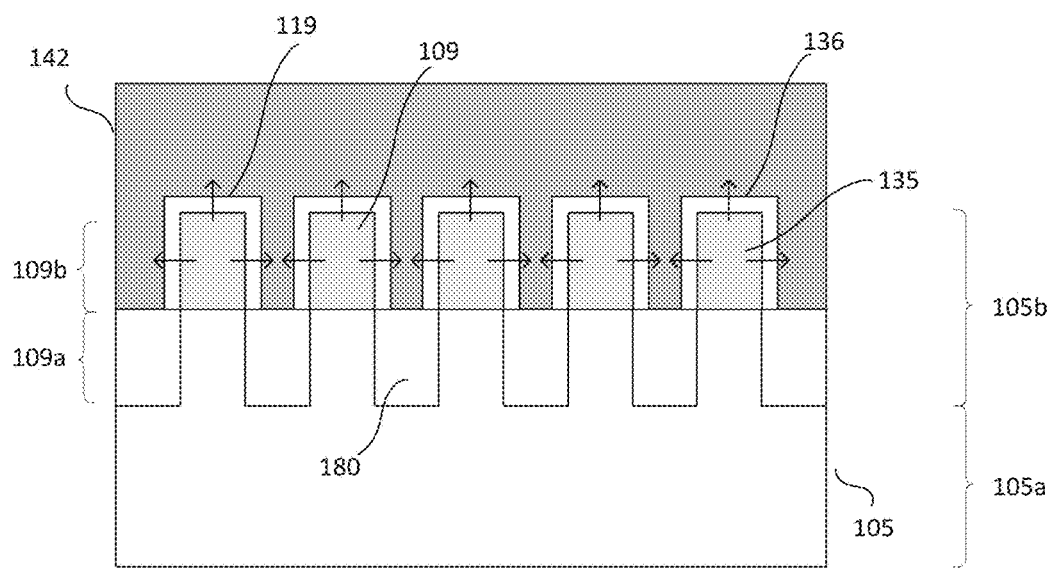
Figure 1C:
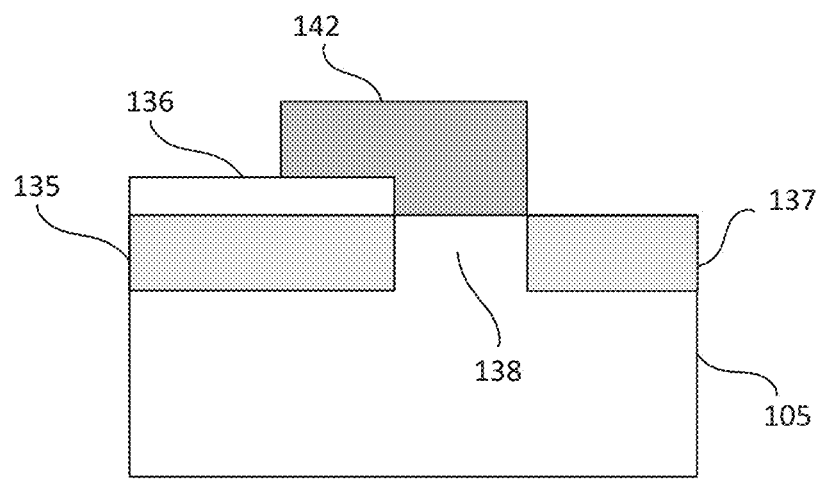
Figure 1D:
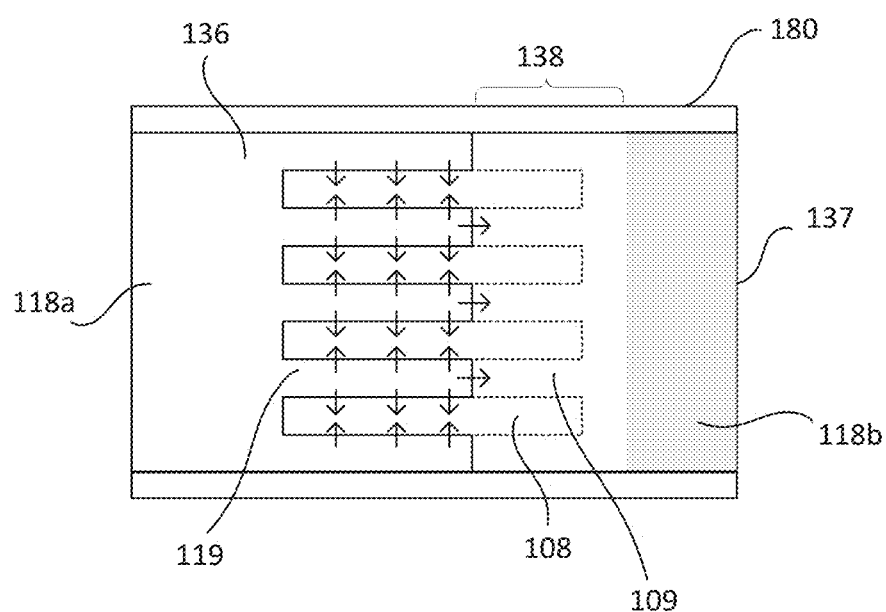

FIGS. 1a-1d show various views of an embodiment of a device 100. FIG. 1a shows a simplified 3-dimensional view of the device, while FIG. 1b shows a cross-sectional view of the device along A-A' and FIG. 1c shows a cross-sectional view of the device along B-B'. FIG. 1d shows a plan view of the device and for illustration purposes, the gate is omitted. The device, in one embodiment, is a transistor. The transistor, for example, is a tunnel field-effect transistor (TFET). Referring to FIGS. 1a-1c, a substrate 105 serves as a base for the device. The substrate may be a silicon substrate. The substrate may be lightly doped with, for example, p-type dopants. Providing other suitable types of substrates, including SiGe, Ge and group III-V semiconductors such as GaSb, GaAs, InP and InAs, including substrates doped with other types of dopants or undoped substrates, are also useful. Other suitable types of substrate, such as crystalline-on-insulator which includes silicon-on-insulator (SOI) type of substrate, may also be useful.

The device 100 may include doped regions having different dopant concentrations. For example, the device 100 may include heavily doped ($x^+$), intermediately doped ($x$) and lightly doped ($x^-$) regions, where x is the polarity type which can be p or n. A lightly doped region may have a dopant concentration of about 1e16 $cm^{-3}$, and an intermediately doped region may have a dopant concentration of about 1e18 $cm^{-3}$, and a heavily doped region may have a dopant concentration of about 1e20 $cm^{-3}$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

The substrate includes a lower part 105a and an upper part 105b. The lower part 105a of the substrate serves as a base, whereas the upper part 105b of the substrate includes a plurality of fin structures 109. The number of fin structures is determined by the width of the transistor. Each of the fin structures, in one embodiment, may be an elongated member. The fin structures, in one embodiment, are disposed in the middle of the substrate. The fin structures may also be disposed at other part of the substrate.

In one embodiment, the fin structure 109 includes a lower part 109a and an upper part 109b. In one embodiment, the adjacent fin structures are isolated by an isolation layer 180 at the lower part 109a. That is, a gap between two adjacent fin structures are partially filled with the isolation layer 180, thus embedding the lower part 109a of the fins 109 within the isolation layer 180. As shown, the upper part of the fin structures 109 protrudes beyond the top surface of the isolation layer 180 and the lower part of the fin structures 109 is embedded within the isolation layer 180. In one embodiment, the fin structure 109 has a width along a first direction (e.g., x direction), a length along a second direction (e.g., y direction) and a height along a third direction (e.g., z direction). As shown in FIG. 1a, the fin structures are disposed along the second direction (e.g., y direction). In one embodiment, the width of the fin structure is about 6-8 nm and the length is about 50 nm. The height of the exposed fin structure, i.e., the upper part of the fin structure, is about 30-40 nm. The length of the fin structure 109 should be sufficient to include a body or channel region (e.g., region over which a gate will be disposed thereon). The pitch, i.e., the sum of fin width and space between adjacent fin structures, may be about 20-30 nm. The dimensions of the fin structures, for example, may depend on the technology nodes.

The isolation layer 180 includes a dielectric material, such as a silicon oxide. In one embodiment, the isolation layer is a high-aspect-ratio process (HARP) oxide. Other suitable types of dielectric material may also be useful. The isolation layer 180, for example, has a height or thickness sufficient to provide isolation from the substrate below and between adjacent fin structures 109. The thickness of the isolation layer, for example, may be about 60-80 nm. Other suitable thickness ranges may also be useful.

In one embodiment, the plurality of the fin structures 109 are connected by a pair of fin connectors 118a and 118b (e.g., first and second fin connectors) at both side of the substrate along the first direction (e.g., x direction). The fin connectors are essentially the substrate 105 that does not make up the fin structures 109.

As shown in FIG. 1a, the gap in between two adjacent fin structures 109 are enclosed by the fin connectors at along the first direction (e.g., x direction), thus forming a slot 108. The slot, like the fin structures, has a width along a first direction (e.g., x direction), a length along a second direction (e.g., y direction) and a height along a third direction (e.g., z direction).

The transistor includes a source in a source area. In one embodiment, the source includes a first source portion 135 and a second source portion 136. The first source portion 135 is a heavily doped region having dopants of a second polarity type for a first polarity type device. For example, the first source portion 135 may contain p-type dopants for a n-type device or n-type dopants for a p-type device. The dopant concentration of the first source portion, for example, may be about 1e19 cm$^{-3}$. Providing a first source portion having other dopant concentration may also be useful.

The first source portion 135 is disposed in the substrate on a first side of the substrate. For example, the first source portion 135 is from the edge of the first fin connector 118a on the first side of the substrate to about middle of the fin structures along the second direction (e.g., y direction). The first source portion 135 may also extend beyond the middle of the fin structures along the second direction (e.g., y direction) as shown in FIG. 1c. In one embodiment, the first source portion 135 extends from the first fin connector 118a to about 40 percent of the length of the fin structures. The first source portion may also extend to other length of the fin structures. However, it may not extend beyond the length of the fin structures.

In one embodiment, the first source portion is disposed above the base (i.e., the lower part 105a) of the substrate, thus forming an elevated first source portion. For example, the elevated first source portion 135 is from the top of the substrate to the top surface of the lower part 109a of the fin structures 109, as shown in FIG. 1b. That is, the depth or bottom of the first source portion 135 is located at about the top surface of the lower part 109a of the fin structures 109, which is above the lower part 105a of the substrate. Providing the bottom of the first source portion 135 at other locations in the fin structures 109 may also be useful. For example, the bottom of the first source portion 135 may be located above or below the top surface of the lower part 109a of the fin structures 109. In some embodiments, the bottom of the first source portion 135 may extend below the lower part of the isolation layer and into the lower part 105a of the substrate 105.

In one embodiment, the second source portion 136 includes an epitaxial layer 136 disposed over the elevated first source portion 135. The epitaxially grown layer 136 lines the elevated first source portion 135, including the top and sides of the first fin connector 118a, and the top and sidewalls of the upper part 109b of the fin structures 109. The epitaxial layer 136 adopts the crystallographic orientation of the underlying substrate, i.e., the elevated first source portion 135. The epitaxial layer, for example, includes a crystalline material having good or high carrier mobility. In one embodiment, the crystalline material includes silicon. Other types of crystalline material may also be useful. For example, the epitaxial layer 136 may include SiGe, Ge or III-V semiconductors such as GaAs, InP and InAs or a combination of the various crystalline materials, depending on the underlying substrate.

As shown in FIGS. 1a-1c, the presence of the epitaxial layer 136 forms an elevated first fin connector 128a corresponding to the underlying first fin connector 118a and elevated fin structures 119 corresponding to the underlying fin structures 109. That is, the source area which includes the first and second source portions has a top surface which extends beyond the top surface of the substrate. The height of the second fin connector 118b and the portion of the fin structures not being part of the source area remains the same. In other words, the height of the non-source area remains unchanged. The difference in height results in a step profile at the border of the source area and non-source area. The presence of the step profile, for example, increases the tunneling area which in turn enhances the tunneling probability. The thickness of the epitaxial layer 136, for example, may be about 5 nm. Providing an epitaxial layer having other thicknesses may also be useful.

In one embodiment, the epitaxial layer 136 includes a first epitaxial layer and a second epitaxial layer (not shown). The first epitaxial layer is disposed over the first source portion 135 and the second epitaxial layer is disposed on the first epitaxial layer. In one embodiment, the first epitaxial layer is an extension of the first source portion 135. The first epitaxial layer is doped with the same polarity type as the first source portion 135. For example, for a first polarity type device, the first epitaxial layer may contain p-type dopants for a n-type device or n-type dopants for a p-type device. The dopant concentration of the first epitaxial layer is similar to the first source portion, for example, may be about 1e19 cm$^{-3}$. Providing a first epitaxial layer having other dopant concentration may also be useful. The second epitaxial layer serves as a heavily doped pocket. For a first polarity type device, the second epitaxial layer serves as a first polarity type heavily doped pocket for the second polarity type source. For example, the second epitaxial layer may contain n-type dopants for a p-type source of a n-type device or p-type dopants for a n-type source of a p-type device. The dopant concentration of the second epitaxial layer, for example, may be about 1e18 cm$^{-3}$. Providing a second epitaxial layer having other dopant concentration may also be useful. In one embodiment, the thickness of the first epitaxial layer may be about 3 nm and the thickness of the second epitaxial layer may be about 2 nm. Providing other thicknesses for the first and second epitaxial layers may also be useful.

A drain 137 is disposed in the substrate on a second side of the substrate. The second side of the substrate is opposite the first side where the source having first and second portions is disposed. For example, the drain 137 is disposed in the second fin connector 118b on the second side of the substrate. In one embodiment, the source and drain are structurally asymmetry. For example, the elevated source includes the first fin connector 118a and fin structures 109, while the drain is essentially disposed in the second fin connector 118b. As shown in FIG. 1c, the drain is from the edge of the second fin connector 118b to about middle of the fin connector 118b along the second direction (e.g., y direction). The drain 137 may also extend beyond the middle of the second fin connector 118b along the second direction (e.g., y direction). However, it may not extend beyond the length of the second fin connector 118b. In one embodiment, the drain 137 is from the top of the substrate to the top surface of the isolation layer 108. That is, the depth or bottom of the drain 137 is located at about the top surface of the isolation layer 108 which within the upper part 105b of the substrate. Providing the bottom of the drain 137 at other locations in the substrate may also be useful. In some embodiments, the bottom of the drain 137 may extend into the lower part 105a of the substrate 105.

In one embodiment, the drain 137 and first source portion 135 are asymmetrically doped. That is, the first source portion and drain are doped with dopants of opposite polarities. When the first source portion 135 is heavily doped with a second polarity type dopants, the drain 137 is heavily doped with a first polarity type dopants for a first polarity type device. For example, the drain 137 may contain n-type dopants for a n-type device or p-type dopants for a p-type device. The dopant concentration of the drain 137, for example, may be about 1e18 cm$^{-3}$. Providing drain having other dopant concentration may also be useful.

A gate 140 is disposed over the substrate. As shown, the gate 140 is disposed over the substrate along the second direction (e.g., y direction) and traverses the substrate. In one embodiment, the gate partially overlaps the source region. For example, the gate is from the elevated first fin connector 128a and extends to about half of the second fin connector 118b adjacent the drain 137, such that the gate covers the step profile. For example, the gate wraps around the elevated source region which includes the elevated first source portion 135 and second source portion (i.e., epitaxial layer) 136. The gate 140 also wraps around the fin 109 and a portion of the second fin connector 118b which do not accommodate the drain 137.

The gate 140 includes a gate electrode 142 and a gate dielectric (not shown). The gate electrode 142, in one embodiment, includes a high-k metal, such as TaN or TiN. Separating the gate electrode and the underlying substrate is the gate dielectric layer. The gate dielectric layer, for example, includes an interfacial and a high-k gate dielectric stack. The interfacial layer, for example, may be SiO$_2$ and the high-k gate dielectric layer, for example, may be HfO$_2$, HfSiON, La$_2$O$_3$, ZrO$_2$ or silicates. As shown in FIG. 1b, the gaps between the fin structures are filled with the gate materials.

As shown in FIG. 1d, a channel 138 is located between the elevated source and drain. The channel, in one embodiment, is located in the upper portion 109b of the fin structures 109 below the gate and between the elevated source and drain. The channel, as shown, resembles a comb-like structure. For example, the second fin connector 118b is the shaft of a comb and the fin structures 109 are the teeth.

The elevated source of the TFET as described in FIGS. 1a-1d are provided with multiple elevated fin structures. The arrows in FIGS. 1b-1d depict the tunneling direction of the TFET. As shown, the presence of the multiple elevated fin structures enlarges the band-to-band tunneling (BTBT) area as compared to conventional lateral TFETs. Therefore, the tunneling probability, which is one of the limitations of obtaining a high on-state current, increases with the enlarged tunneling area. For the conventional TFETs, a steep SS can only be achieved over a narrow drain current (Id) range due to the non-uniform tunneling paths. On the contrary, due to the presence of the elevated fin structures which enables uniform tunneling paths, a steep SS over a wider ID range can be achieved by the TFET as described herein. In addition, the heavily doped pocket at the source area increases the band bending at the source-channel junction, boosting the on-state current. Furthermore, the thickness and dopant concentration of the pocket are engineered in a way that the onset of tunneling occurs within the highly doped pocket to further boost the on-state current. As a result, a higher on-state current can readily be obtained. Furthermore, the gate which wraps around the elevated source provides a uniform gate control which reduces the control variations. The uniform gate control improves the gate electrostatics. All these benefits lead to a lower power consumption which is ideal for Internet of Things (IoT).

FIG. 2a-2e show a simplified 3-dimensional view (A), cross-sectional view (B) along A-A's and cross-sectional view (C) along B-B' of an embodiment of a process 200 for forming a device 100. The device 100 formed, for example, is similar to that shown and described in FIGS. 1a-1d. For the sake of brevity, common elements and elements having the same reference numerals may not be described or described in detail.

Figure 2A:
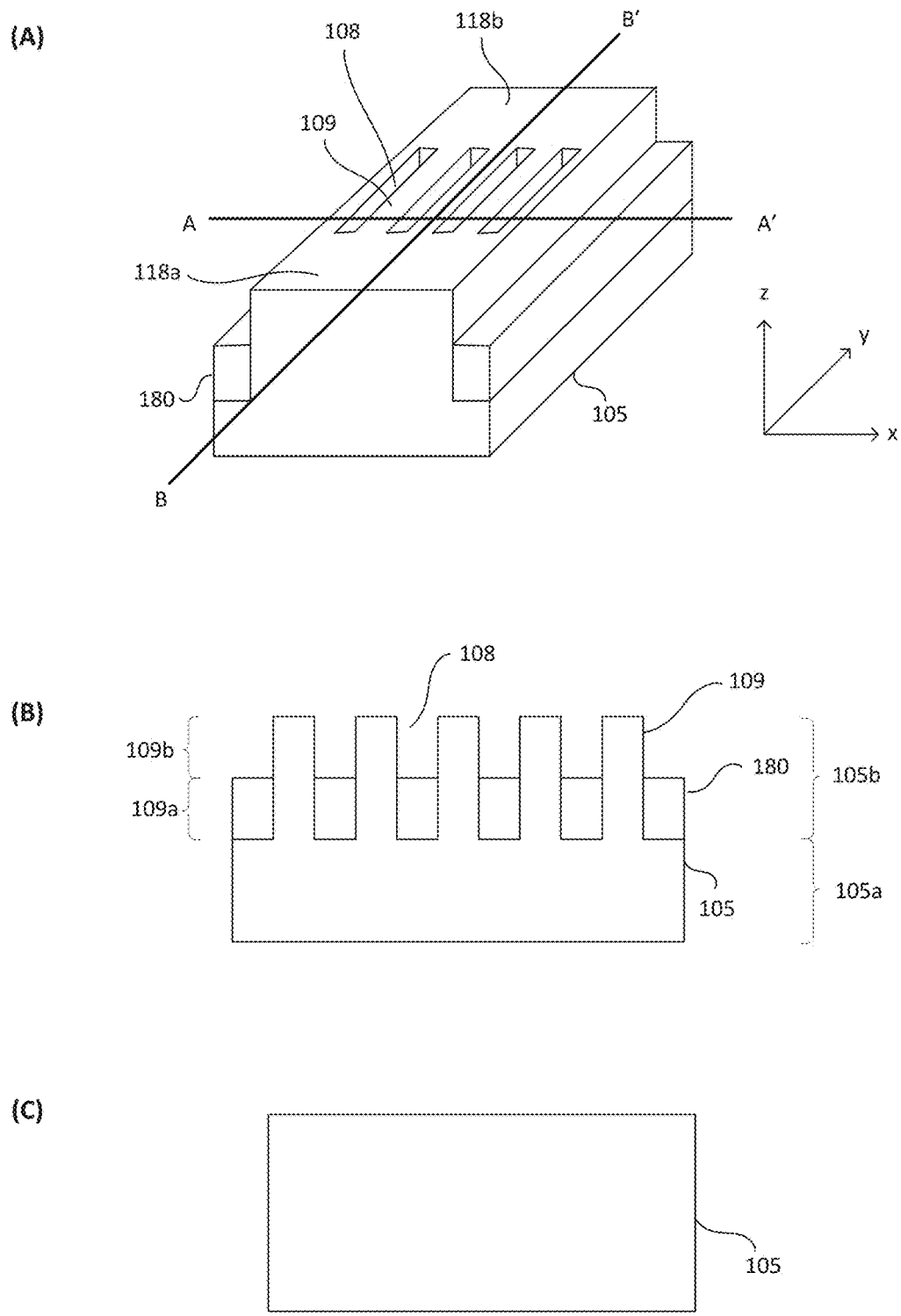
FIGS. 2a-2f show various cross-sectional views of an embodiment of a process for forming a device.

Referring to FIG. 2a, a substrate 105 is provided. The substrate may be a silicon substrate. The substrate may be lightly doped with second polarity type dopants, such as, p-type dopants. Providing other suitable types of substrates, including SiGe, Ge and group III-V semiconductors such as GaSb, GaAs, InP and InAs, including substrates doped with other types of dopants or undoped substrates, are also useful. Other suitable types of substrate, such as crystalline-on-insulator which includes SOI type of substrate, may also be useful.

The substrate 105 is processed to form a fin structures 109. In one embodiment, a fin structure has sufficient length to include a body or channel region, such as that described in, for example, FIGS. 1*a*-1*d*. The dimension of the fin structure may, for example, depend on the technology nodes.

Forming the fin structures 109 may be achieved using various methods. The fin structures, for example, may be formed by patterning the substrate. In one embodiment, a hard mask layer (not shown), such as silicon oxide or silicon nitride, is formed on the substrate 105. Other suitable types of materials which are selective to the isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structures. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist is transferred to the hard mask by, for example, an anisotropic etch, such as a reactive ion etch (RIE). The soft mask is removed. An anisotropic etch, such as RIE, is performed to remove portions of the substrate surface unprotected by the hard mask, forming a plurality of fin structures 109 in the top surface of the substrate. In one embodiment, the etch is a time based etch due to the absence of a stop layer.

The process continues to form an isolation layer 180. To form the isolation layer, a dielectric layer, is formed over the substrate 105 covering the fin structures 109. In one embodiment, the dielectric layer includes a silicon oxide layer. Other suitable types of dielectric layer may also be useful. The dielectric layer, for example, may be formed over the substrate using CVD or high aspect ratio process (HARP). Other suitable techniques for forming the isolation layer may also be useful. In one embodiment, a polishing process, such as a chemical mechanical polishing process (CMP) is performed to planarize the dielectric layer to the top surface of the hard mask (not shown) over the fin structures. A removal process, such as selective to the dielectric layer which includes oxide material, is performed to remove or recess portions of the oxide to form the isolation layer 180 as shown in FIG. 2*a*. The removal process may include dry etch, wet etch or a combination thereof. The isolation layer, for example, has a height or thickness sufficient to provide isolation from the substrate below and between adjacent fin structures. For example, the isolation layer is recessed to a thickness which is less than the height of the fin structures. As shown, the fin structure has an upper part 109*b* which protrudes beyond the top surface of the isolation layer 180 and a lower part 109*a* which is embedded within the isolation layer 180. The thickness of the isolation layer, for example, may be about 80 nm. Other suitable thickness ranges may also be useful. After forming the isolation layer 180, the hard mask layer is removed, for example, by ashing.

Other methods of forming the fin structures 109 and isolation layer 180 may also be useful. For example, the fin structures and isolation layer may be formed by using a spacer lithography method, such as the Sidewall Image transfer (SIT) or Self-Aligned Double Patterning (SADP) method.

Figure 2B:
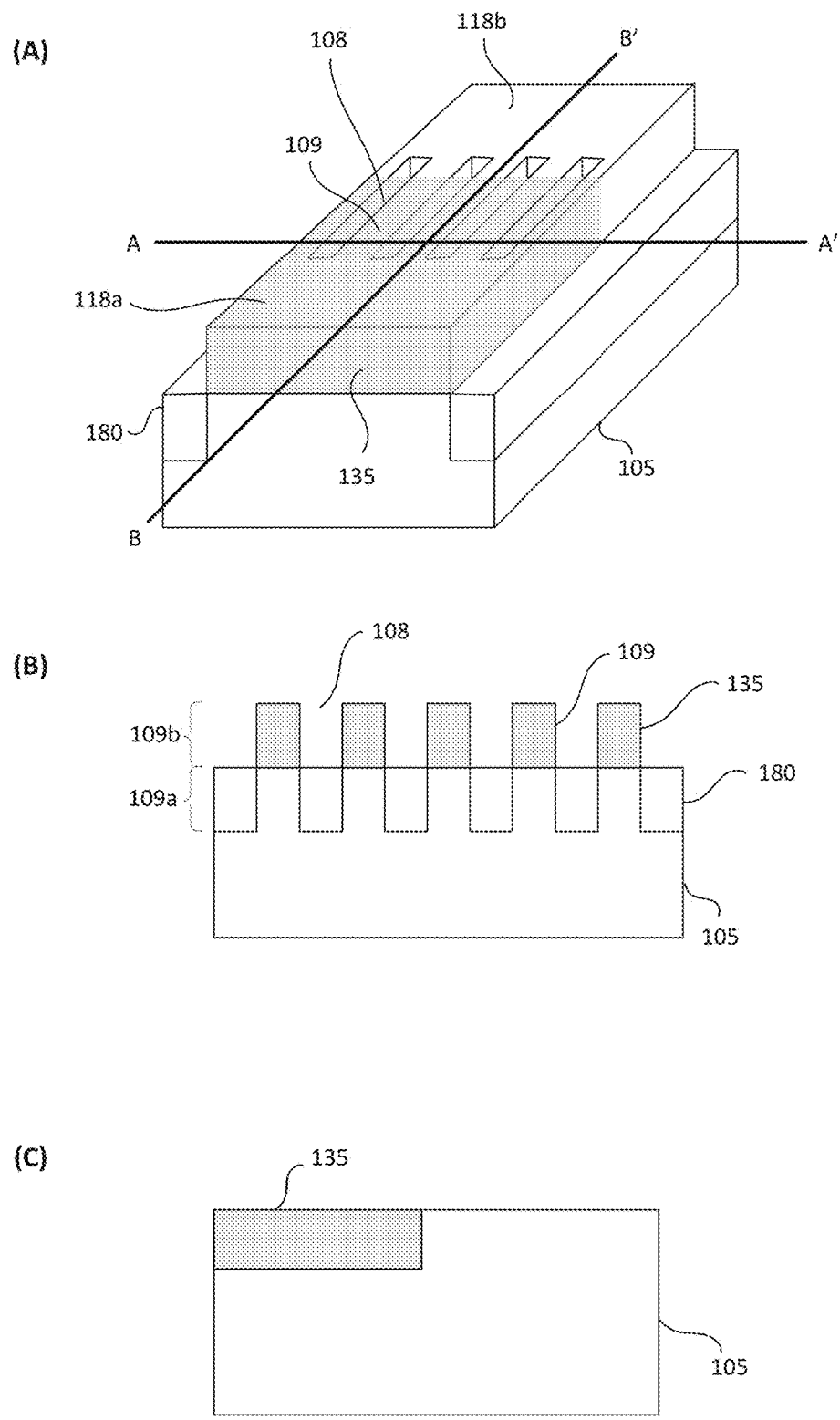

Referring to FIG. 2*b*, the process continues to form a heavily doped first source portion 135. The first source portion 135 is formed on a first side of the substrate. To form the first source portion, an implant process is performed with an implant mask. The implant mask, for example, may be a patterned photoresist layer. The implant mask exposes the portion of the substrate which dopants are to be implanted. For a first polarity type device, second polarity type dopants are implanted into the substrate. The dopant concentration and process parameters of the implantation, such as dose and energy, may be appropriately selected based on design requirements. As shown, the first source portion 135 is from the edge of the first side of the substrate to about half of the length of the fin structures along the second direction (e.g., y direction). The depth or bottom of the first source portion 135 is located at about the top surface of the lower part 109*a* of the fin structures 109. Providing the bottom of the first source portion 135 at other locations in the fin structures 109 may also be useful. For example, the bottom of the first source portion 135 may be located above or below the top surface of the lower part 109*a* of the fin structures 109. After forming the first source portion, the implant mask is removed. For example, the mask is removed by ashing. Other techniques for removing the implant mask may also be useful.

Figure 2C:
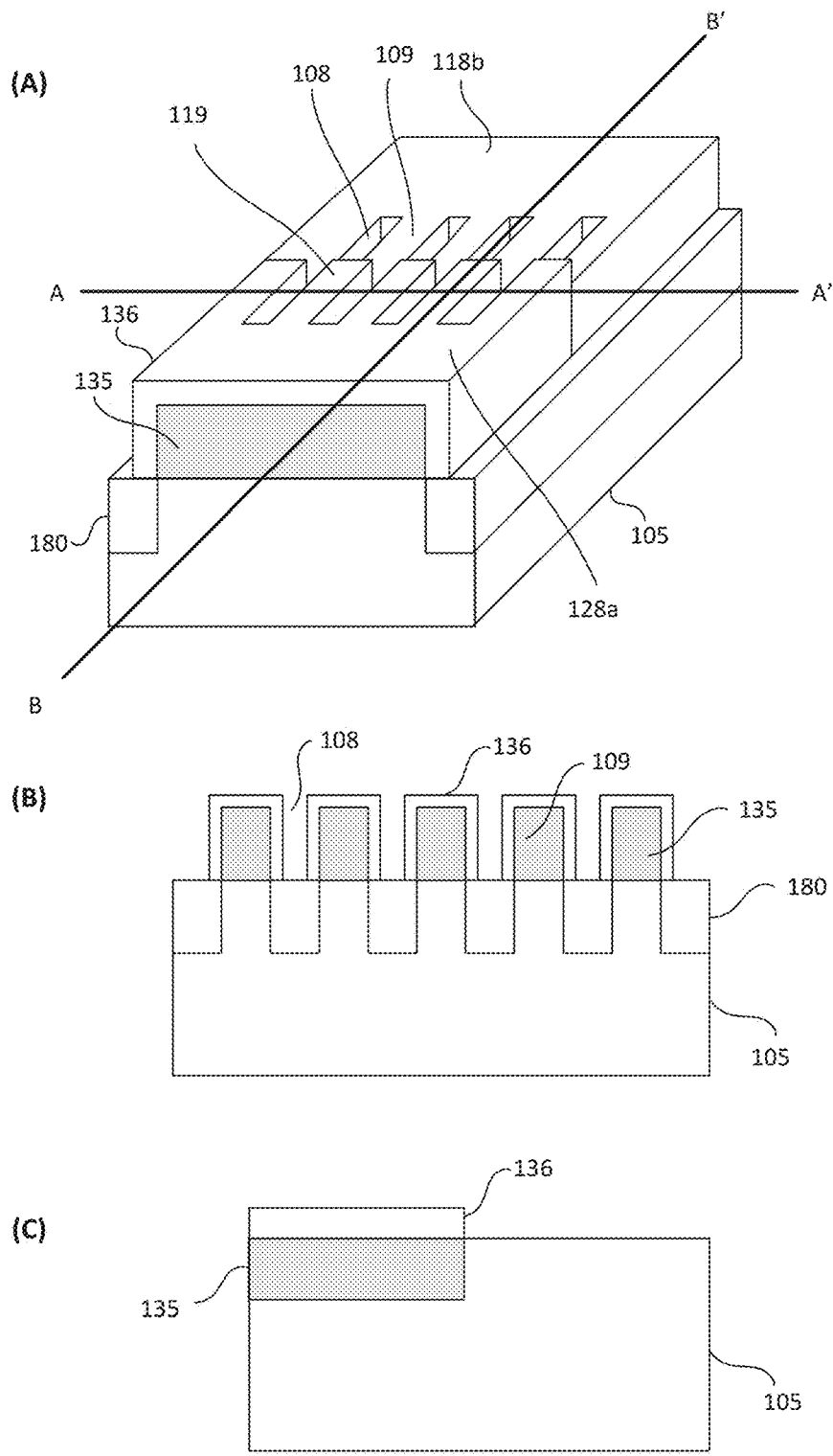

In FIG. 2*c*, the process continues to form a second source portion 136 over the first source portion 135. The selective epitaxial growth (SEG) process is performed to form the second source portion 136. The SEG process selectively forms a crystalline epitaxial layer on the entire exposed first source portion 135 not shielded by a mask. In one embodiment, the crystalline epitaxial layer includes two parts differentiated by the type of dopants. For example, the epitaxial layer includes a first epitaxial layer having second polarity type dopants and a second epitaxial layer having first polarity type dopants, for a first polarity type device. The first epitaxial layer is grown first on the first source portion and is in situ doped with second polarity type dopants as it is formed. The SEG process continues to form the second epitaxial layer on the first epitaxial layer. The second epitaxial layer is in situ doped as it is formed. Alternatively, the dopants may be implanted into the epitaxial layer by ion implantation assisted by an implant mask. The dopant concentration and process parameters of the implantation, such as dose and energy, may be appropriately selected based on design requirements.

Figure 2D:
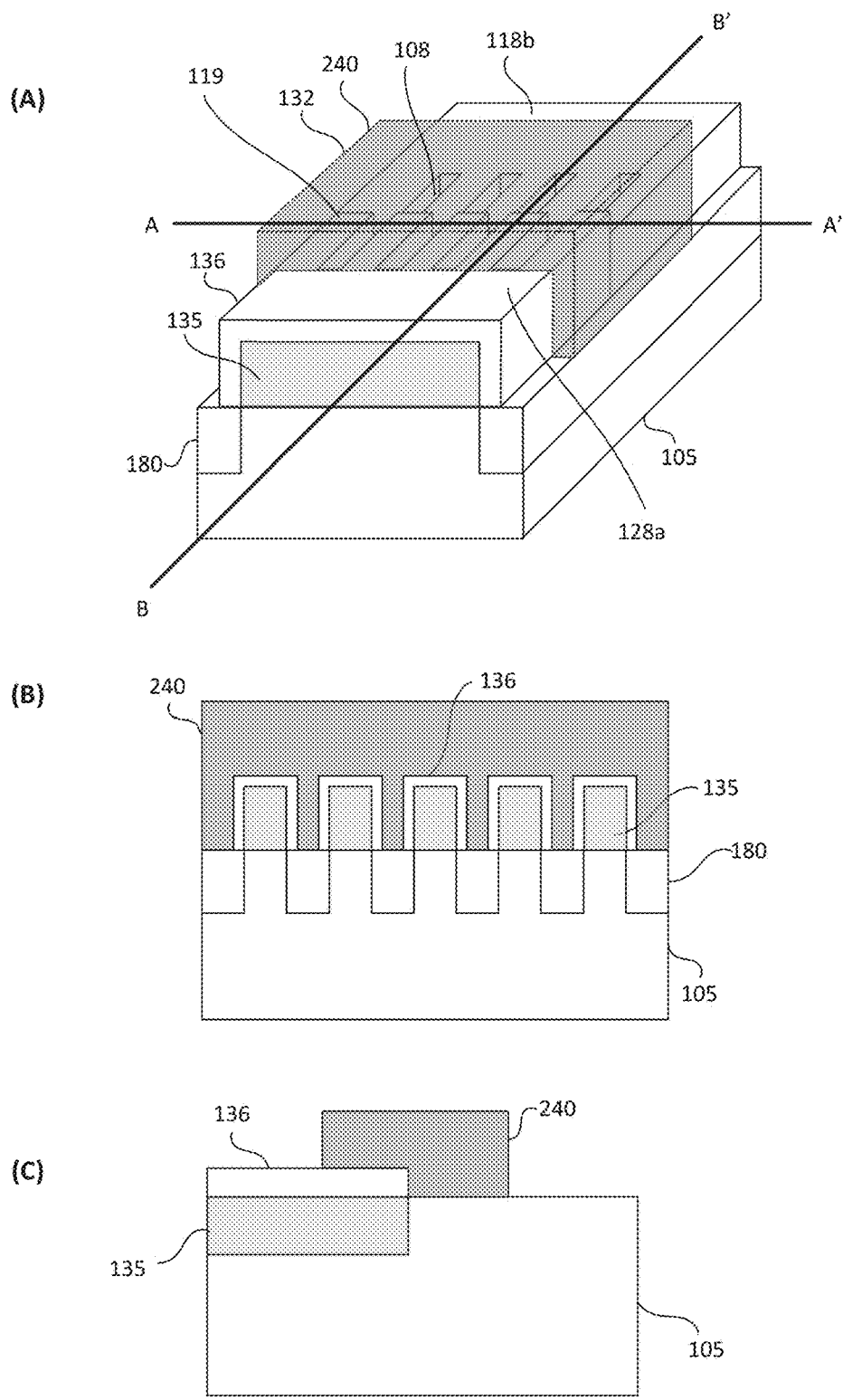

Referring to FIG. 2*d*, the process continues to form dummy gate 240. For example, a dummy gate dielectric layer and a dummy gate electrode layer are conformally formed over the substrate covering the fin structures 109 and a part of the second fin connector 118*b* adjacent the fins 109. In the case of a dummy gate, it may be formed of any type of material which can be selectively removed from the fin structures and fin connector and a subsequently formed dielectric layer. For example, the dummy gate electrode layer may include polysilicon while the dummy gate dielectric layer may include silicon nitride or silicon oxide. Other suitable types of materials may also be used for the dummy gate layers. The dummy gate dielectric and dummy gate electrode layers are patterned to form a patterned gate 240 which serves as a dummy gate. For example, suitable mask and etch techniques may be employed to remove exposed portions of the dummy gate dielectric and dummy gate electrode layers, while dummy gate dielectric and dummy gate electrode layers protected by the mask remain and serve as the dummy gate 240. The dummy gate, for example, wrap around and traverses the channel region of the fin structures 109.

The process continues to form sidewalls spacers (not shown). The sidewall spacers, for example, include silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques for forming the spacer dielectric layer or forming other types of spacers may also be useful. The spacer dielectric layer is anisotropically etched, such as by RIE, to remove horizontal portions, leaving non-horizontal portions on the sidewalls of the dummy gate as the spacers.

Figure 2E:
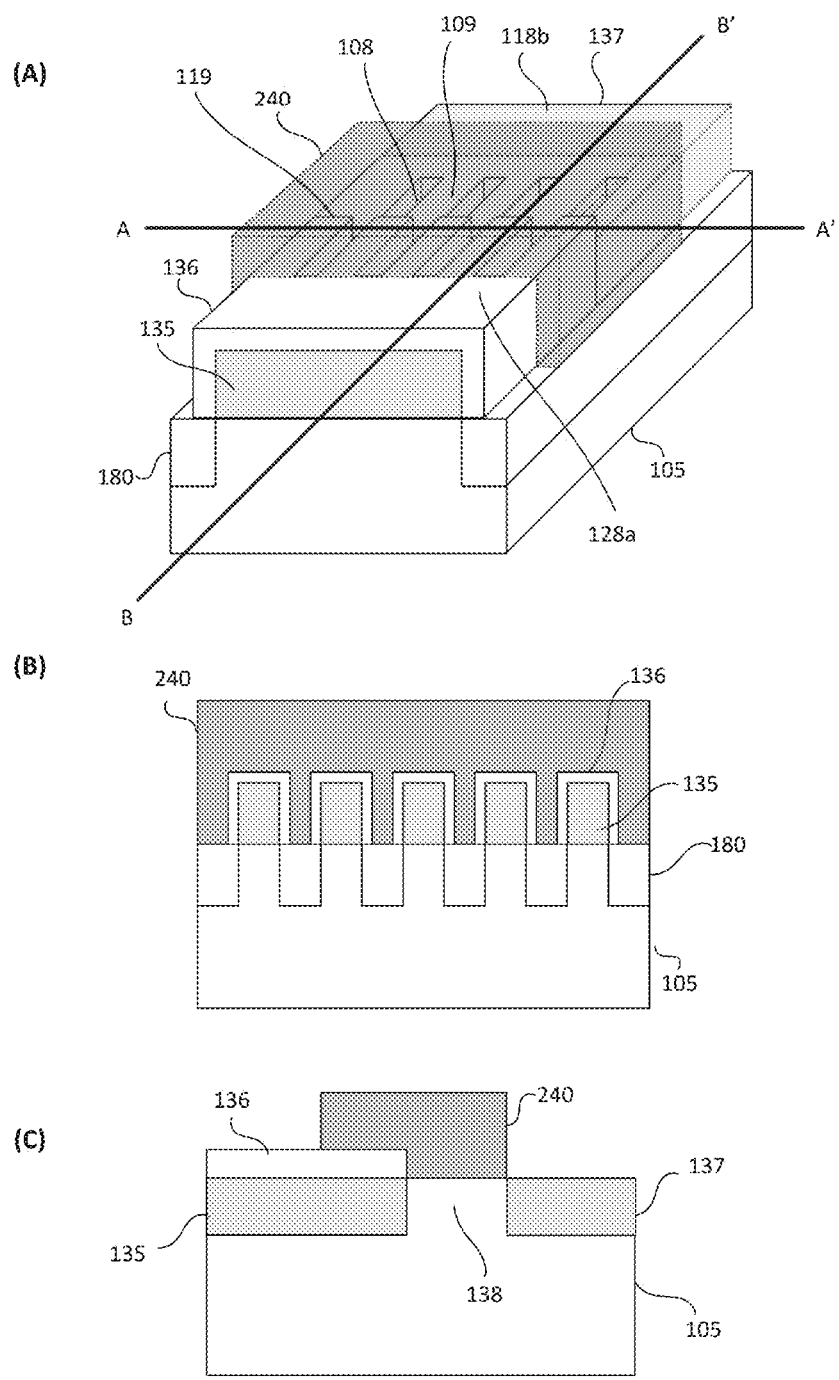

In FIG. 2e, the process continues to form a heavily doped drain 137. The drain is formed on a second side of the substrate opposite the first side where the source is formed. The drain is formed by mask and implant techniques. The implant mask, for example, may be a patterned photoresist layer. The implant mask exposes the portion of the substrate which dopants are implanted. For a first polarity type device, first polarity type dopants are implanted into the substrate. The dopant concentration and process parameters of the implantation, such as dose and energy, may be appropriately selected based on design requirements. As shown, the drain 137 is from the edge of the second side of the substrate to about half of the length of the second fin connector 118b along the second direction (e.g., y direction). After forming the drain, the implant mask is removed. For example, the mask is removed by ashing. Other techniques for removing the implant mask may also be useful.

The process continues to form metal silicide contacts (not shown) on the contact regions of the device, such as the source and drain regions. Subsequently, a dielectric layer (not shown) is formed on the substrate, covering the dummy gate 240, source having the first and second source portions and drain 137. The dielectric layer, for example, serves as a PMD layer. The dielectric layer, for example, includes a silicon oxide layer and is formed by CVD. Other suitable types of dielectric layer and forming techniques may also be useful. The PMD layer is planarized. The planarizing process, for example, is a CMP process. The planarizing process removes excess dielectric or PMD layer, forming a planar top surface and a co-planar top surface with the dummy gate 240. After planarization, the exposed dummy gate 240 is selectively removed. Removal of the dummy gate may be performed by dry etch, wet etch or a combination thereof. For example, a wet etch selective to the dielectric layer and sidewall spacers may be performed. The dummy gate may be removed by wet etch using different chemistries. Removal of the dummy gate leaves a gate trench or gate opening on the substrate while the dielectric layer protects and covers the source and drain.

Figure 2F:
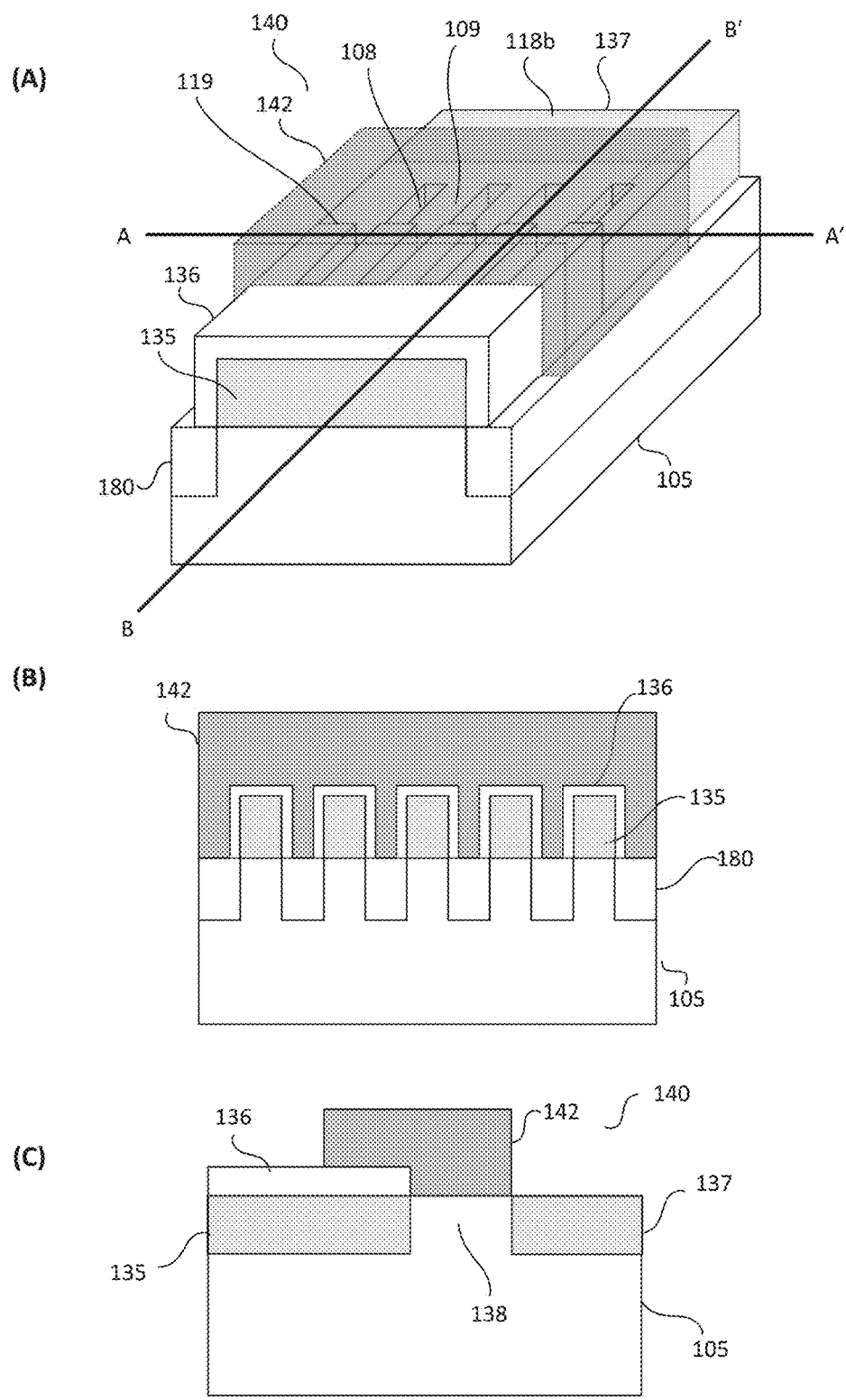

Referring to FIG. 2f, the process continues to form a high-k metal gate 140 in the gate trench or gate opening. Forming the metal gate includes forming a gate dielectric layer (not shown) and a metal gate electrode layer 142 on the substrate and filling the gate opening. The gate dielectric layer, in one embodiment, includes an interfacial and a high-k gate dielectric stack. The interfacial and high-k gate dielectric stack layers line the gate openings and PMD layer. The interfacial layer, for example, may be $SiO_2$ and the high-k gate dielectric layer, for example, may be $HfO_2$, HfSiON, $La_2O_3$, zirconium oxide or silicates thereof formed by atomic layer deposition (ALD) process. A metal gate electrode layer, such as TaN or TiN, may be formed over the dielectric layers by ALD, CVD or physical vapor deposition (PVD). Other types of gate dielectric materials, electrode materials or forming techniques may also be useful. These layers are planarized, forming a planar top surface between the PMD layer (not shown) and metal gate electrode layer. The metal gate electrode layer may be in situ doped during formation or doped by ion implantation after formation to reduce resistance, adjust $V_T$, adjust work function or a combination thereof.

The process continues with front-end-of-line (FEOL) processing. For example, processes may be performed to complete the formation of the device. The processes may include forming via contacts or contact plugs to contact regions of the transistor. Additional processes, such as back-end-of-line (BEOL) processing, may be performed to finish the manufacturing of the device. The additional processes may include forming of one or more interconnect levels, final passivation, dicing, assembly, packaging and testing. Other processes are also useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising: providing a substrate; patterning the substrate to form a primary fin structure of a transistor having a fin height Hf, the primary fin structure comprises first and second end portions separated by a middle portion along a channel width direction, the middle portion comprises a plurality of slots which create secondary fin structures coupling the first and second end portions; forming a source in the first end portion of the primary fin structure; forming a drain in the second end portion of the primary fin structure, where a distance between the source to the drain defines a channel; and forming a gate over the substrate, wherein the gate wraps around the middle portion of the primary fin structure and channel; wherein the source comprises a first polarity type source; the drain comprises a second polarity type drain; and the transistor comprises a tunneling field effect transistor.

2. The method of claim 1 wherein forming the gate comprises forming a gate dielectric and a gate electrode over the gate dielectric.

3. The method of claim 1 wherein forming the source forms an extended source which extends into the middle portion of the primary fin structure under the gate.

4. The method of claim 3 wherein forming the source comprises forming a source epitaxial layer over the primary fin structure of the source.

5. The method of claim 4 wherein:
the source of the primary fin structure comprises first polarity type dopants; and
the source epitaxial layer comprises second polarity type dopants.

6. The method of claim 1 comprises forming an isolation on the substrate, wherein the isolation comprises a dielectric which fills gaps in the substrate created by the primary and secondary fin structures, wherein the isolation has an isolation height $H_I$ which is less than $H_F$, creating upper and lower portions of the fin structure delineated $H_I$.

7. The method of claim 1 wherein the channel of the transistor is disposed in the primary fin structure between the source and drain under the gate.

8. The method of claim 1 wherein forming the source comprises forming a source epitaxial layer over the primary fin structure of the source.

9. The method of claim 8 wherein:
the source of the primary fin structure comprises first polarity type dopants; and
the source epitaxial layer comprises second polarity type dopants.

10. The method of claim 9 wherein the drain comprises second polarity type dopants.

11. The method of claim 1 wherein forming the source comprises forming the source prior to forming the gate.

12. The method of claim 11 wherein forming the drain comprises forming the drain after forming the gate.

13. A method for forming a device comprising: providing a substrate; patterning the substrate to form a primary fin structure of a transistor having a fin height Hf, the primary fin structure comprises first and second end portions separated by a middle portion along a channel width direction, the middle portion comprises a plurality of slots which create secondary fin structures coupling the first and second end portions: forming an isolation on the substrate, wherein the isolation comprises a dielectric which fills gaps in the substrate created by the primary and secondary fin structures, wherein the isolation has an isolation height Hi which is less than Hf, creating upper and lower portions of the fin structure delineated Hi; forming a source in the first end portion of the primary fin structure: forming a drain in the second end portion of the primary fin structure; and forming a gate over the substrate, wherein the gate is disposed on the middle portion of the primary fin structure and wraps around the secondary fin structures; wherein the source comprises a first polarity type source; the drain comprises a second polarity type drain; and the transistor comprises a tunneling field effect transistor.

14. The method of claim 13 wherein forming the source forms an extended source which extends into the middle portion of the primary fin structure under the gate.

15. The method of claim 14 wherein:
the source of the primary fin structure comprises first polarity type dopants; and
the source epitaxial layer comprises second polarity type dopants.

16. The method of claim 15 wherein the drain comprises second polarity type dopants.

17. The method of claim 13 wherein forming the source comprises forming a source epitaxial layer over the primary fin structure of the source.

18. A method for forming a device comprising: providing a substrate; patterning the substrate to form a primary fin structure of a transistor having a fin height Hf, the primary fin structure comprises first and second end portions separated by a middle portion along a channel width direction, the middle portion comprises a plurality of slots which create secondary fin structures coupling the first and second end portions: forming a source in the first end portion of the primary fin structure: and forming a drain in the second end portion of the primary fin structure; wherein the source comprises a first polarity type source; the drain comprises a second polarity type drain; and the transistor comprises a tunneling field effect transistor.

* * * * *